United States Patent [19]
Eddy

[11] Patent Number: 5,508,255
[45] Date of Patent: Apr. 16, 1996

[54] EPITAXIAL THALLIUM HIGH TEMPERATURE SUPERCONDUCTING FILMS FORMED VIA A NUCLEATION LAYER

[75] Inventor: Michael M. Eddy, Goleta, Calif.

[73] Assignee: Superconductor Technologies, Inc., Santa Barbara, Calif.

[21] Appl. No.: 270,960

[22] Filed: Jul. 5, 1994

[51] Int. Cl.$^6$ ................................................ H01L 39/24
[52] U.S. Cl. ........................ 505/473; 505/474; 505/475; 505/238; 505/501; 427/62; 427/419.3
[58] Field of Search .................................. 505/473, 474, 505/475, 501, 238, 120, 742; 427/62, 63, 419.2, 419.3

[56] References Cited

U.S. PATENT DOCUMENTS 5,071,830  12/1991  Olson et al. .
5,139,998  8/1992  Eddy et al. .

OTHER PUBLICATIONS

Cheung et al, "Reproducible growth of high quality $YBa_2Cu_3O_{7-x}$ film on (100) MgO with a $SrTiO_3$ buffer layer by pulsed laser deposition", Appl. Phys. lett. 60(25), Jun. 1992, pp. 3180–3182.

Liou et al, Appl. Phys. lett. 60(22) Jun. 1992, pp. 2803–2805.

Holstein et al, Appl. Phys. lett. 61(8) Aug. 1992, pp. 982–984.

Hedges et al, Electron. lett., 27(25) 1991, pp. 2312–2313.

"Crystallography and Microstructure of Tl–Ca–Ba–Cu–O Superconducting Oxides," Appl. Phys. Lett. 53(5), Aug. 1, 1988, pp. 432–434, Beyers, et al.

"Preparation of Supercondcuting Tl–Ca–Ba–Cu Thin Films by Chemical Deposition," App. Phys. Lett. 55(2), Jul. 10, 1989, pp. 188–190, Olson, et al.

*Primary Examiner*—Roy V. King
*Attorney, Agent, or Firm*—Lyon & Lyon

[57] ABSTRACT

The present invention comprises a high quality, epitaxial thallium-based HTS thin film on MgO and other substrates and methods of providing the same. The present invention is achieved using a nucleation layer which provides a template for subsequent growth. Specifically, YBCO and/or YBCO analog films (films having growth characteristics and physical structures analogous to YBCO) are used as nucleation layer(s) on MgO and other substrates to enable the growth of epitaxial thallium-based HTS films.

33 Claims, 2 Drawing Sheets

EPITAXIAL THALLIUM HIGH TEMPERATURE SUPERCONDUCTING FILMS FORMED VIA A NUCLEATION LAYER

FEDERAL FUNDS STATEMENT

Federal funds from Strategic Defense Initiative/Innovative Science and Technology under Contract No. N00014-92-C-2155 were used in the reduction to practice of the invention.

FIELD OF THE INVENTION

The present invention relates to epitaxial high temperature superconductor thin films on substrates preferably having low (e.g. less than 30) and isotropic dielectric constants, and a low dielectric loss tangent (e.g. less than $10^{-4}$) particularly epitaxial high temperature superconductor thin films for use in microwave and/or RF applications. For example, the present invention relates to epitaxial thallium and copper oxide based superconducting thin films, such as TBCCO, on MgO.

BACKGROUND

There are many benefits to including superconductive elements in electronic circuitry. Superconductivity refers to that state of metals and alloys in which the electrical resistivity is zero when the specimen is cooled to a sufficiently low temperature. The temperature at which a specimen undergoes a transition from a state of normal electrical resistivity to a state of superconductivity is known as the critical temperature ($T_c$). The use of superconductive material in circuits is advantageous because of the elimination of normal electrical resistive losses.

In the past, attaining the $T_c$ of known superconducting materials required the use of liquid helium and expensive cooling equipment. In 1986 a superconducting Bednorz and Muller, Possible High Tc Superconductivity in the Ba—La—Cu—O System, 64 Z.Phys. B-Condensed Matter 189 (1986). Since that announcement superconducting materials having higher critical temperatures have been discovered. Collectively these are referred to as high temperature superconductors (HTSs). Currently, HTSs having critical temperatures in excess of the boiling point of liquid nitrogen, 77 K (i.e. about −196° C. or about −321° F.) at atmospheric pressure, have been disclosed.

Superconducting compounds consisting of combinations of alkaline earth metals and rare earth metals such as barium and yttrium in conjunction with copper (known as "YBCO superconductors") were found to exhibit superconductivity at temperatures above 77 K. See, e.g., Wu, et al., Superconductivity at 93 K in a New Mixed-Phase Y—Ba—Cu—O Compound System at Ambient Pressure, 58 Phys. Rev. Lett. 908 (1987). In addition, high temperature superconducting compounds containing bismuth have been disclosed. See, e.g., Maeda, A New High-Tc Oxide Superconductor Without a Rare Earth Element, 37 J. App. Phys. L209 (1988); and Chu, et al., Superconductivity up to 114 K in the Bi—Al—Ca—Br—Cu—O Compound System Without Rare Earth Elements, 60 Phys. Rev. Lett. 941 (1988). Furthermore, superconducting compounds containing thallium have been discovered to have critical temperatures ranging from 90 K to 123 K (some of the highest critical temperatures to date). See, e.g., Koren, et al., 54 Appl. Phys. Lett. 1920 (1989).

These HTSs have been prepared in a number of forms. The earliest forms were preparation of bulk materials, which were sufficient to determine the existence of the superconducting state and phases. More recently, HTS thin films on various substrates have been prepared which have proved to be useful for making practical superconducting devices.

It is desirable to use HTS films for microwave and RF applications. Optimally, such HTS films must have low surface resistance and must be able to handle significant power levels. It is preferred that HTS films used for microwave applications have a high $T_c$ and have a substantially linear response at high power levels (i.e. $R_s$ does not significantly vary with RF current density). Many of these criteria are satisfied by HTS films which have both a low fault density and are epitaxial. Epitaxy refers to that state of a film wherein there is a systematic and single (or uniform) orientation of the crystal lattice of the film with respect to the substrate. However, not many films exhibit linear performance characteristics.

Epitaxy may even be necessary for certain HTS films to exhibit desirable microwave and RF applications properties. For example, epitaxial TBCCO thin films (i.e. films containing thallium, barium, optionally calcium, and copper oxide) exhibit desirable microwave properties. See Eddy, et al., "Surface Resistance Studies of Laser Deposited Superconducting $Tl_2Ba_2Ca_1Cu_2O_8$ Films," 70 J. Appl. Phys. 496 (1991). Examples of various phases of such TBCCO thin films which are known to exist include $Tl_2Ca_1Ba_2Cu_2O_8$ (i.e. 2122), $Tl_2Ca_2Ba_2Cu_3O_{10}$ (i.e. 2223), $Tl_1Ca_1Ba_2Cu_2O_7$ (i.e. 1122), and $Tl_1Ca_2Ba_2Cu_3O_9$ (i.e. 1223). See Olson, et al., "Preparation of Superconducting Tl—Ca—Ba—Cu Thin Films by Chemical Deposition," 55(2) Appl. Phys. Lett. 188 (1989); and Beyers, et al., "Crystallography and Microstructure of Tl—Ca—Ba—Cu—O Superconducting Oxides," 53(5) Appl. Phys. Lett. 432 (1988). However, TBCCO thin films having optimal or uniform nucleation grow on only a few substrates (e.g. such TBCCO thin films have been shown to grow on $LaAlO_3$ and $SrTiO_3$).

In addition, $LaAlO_3$ is the only substrate at present upon which TBCCO films suitable for microwave applications may be grown, but such films exhibit non-linear performance characteristics. Also disadvantageously, $LaAlO_3$ substrate exhibits a high dielectric constant which is variable due to twinning. These properties of $LaAlO_3$ make microwave design difficult. For example, microwave design and microwave performance modelling is limited by the use of $LaAlO_3$ as a substrate. The high dielectric constant results in line widths at high frequencies which are narrow, and excessive twinning limits frequency setability to ±1 percent.

Important microwave and RF applications require twin-free, low dielectric constant substrates. In addition, it is preferred that the substrates be available in large areas (two inch round or greater) to fabricate devices such as narrow band filters at desired frequencies. Substrates such as MgO satisfy these criteria. However, good HTS thin films which are thallium and copper oxide based, such as TBCCO, do not easily grow epitaxially on MgO. Often, such HTS films grow on MgO in several orientations, resulting in high angle grain boundaries and degraded superconducting properties.

The prior art has failed to provide a combination of both a good HTS film and a good substrate which exhibit properties suitable for microwave and/or RF applications. Specifically, the prior art does not provide a device suitable for such applications comprising a HTS film having low surface resistance, exhibiting substantially linear response characteristics at high RF current density (i.e. $R_s$ does not significantly vary with RF current density), and which can be grown on a substrate which has a low dielectric constant, which is twin-free, and which does not degrade the superconducting properties of the film.

SUMMARY OF THE INVENTION

The present invention comprises a high temperature superconducting (HTS) film on a substrate (and a method of providing the same) wherein the HTS film and substrate combination exhibits properties suitable for microwave and/or RF applications. Specifically, the present invention provides a device suitable for microwave and/or RF applications comprising HTS films having low surface resistance, exhibiting linear response characteristics at high RF current density (i.e. $R_s$ does not significantly vary with RF current density), and which can be grown on a substrate which has a low dielectric constant, which is twin-free, and which does not degrade the superconducting properties of the film. The present invention also comprises a method of providing the same.

The present invention comprises a high quality, epitaxial HTS thin film which is thallium and copper oxide based, such as TBCCO, on both MgO and other substrates and a method of providing the same. It is preferred that a thallium based HTS film be used because such films exhibit $T_c$s which are higher than other films.

The present invention is achieved using a nucleation layer to provide a template for subsequent HTS film growth. Broadly, a two-step process consists of first, forming in situ an intermediate layer of YBCO (or a structural analog) on a support layer, and second forming a thallium and copper oxide based film on the intermediate layer by precursor deposition followed by a post-deposition thermal processing for crystallization. In this way the benefits of high quality in situ crystal growth are combined with the predictable thallium HTS manufacturing techniques to form a high-quality thallium HTS film. More specifically, a YBCO film or a film having growth characteristics (e.g. can be grown in situ) and physical structures (e.g. lattice structures in the a-b plane) analogous to YBCO films (i.e. a YBCO analog) is used as a nucleation layer on MgO or another substrate to enable the growth of epitaxial HTS films such as TBCCO. Although YBCO may form an HTS film itself, it is not necessary that the nucleation layer be an HTS or a superconducting film. For example, YBCO could be used or a bismuth film could be used in place of YBCO. Bismuth films qualify as YBCO analogs as bismuth films and YBCO films both can be grown in situ epitaxially and both have analogous a-b plane lattice structures. Additional examples of films which can be used as a nucleation layer (i.e. films which qualify as YBCO analogs) include bismuth cuprates, neodymium cerium cuprates, lanthanum cuprates, and strontium cuprates. Doping or substitutions in such films may be used. For example, praseodymium or other rare earth may be substituted for the yttrium in the YBCO to make an acceptable non-superconducting nucleation film.

In the preferred embodiment, YBCO is used as a nucleation layer between MgO and TBCCO. In situ growth of YBCO occurs in a single, epitaxial orientation on MgO. Using such a layer of YBCO as a nucleation layer for TBCCO allows the orientation information to pass between the two layers. In addition, using a thin layer of YBCO as a nucleation layer allows the passage of orientation information without degradation of the top TBCCO layer due to interdiffusion between YBCO and TBCCO. With a thin YBCO layer there is not sufficient interdiffusion to significantly degrade the superconducting properties of the TBCCO layer. Preferably, the YBCO layer is between about 10–600 Å in thickness as the layer should be thick enough to be pin-hole free and the unit cell thickness of YBCO is approximately 10 Å.

The preferred method of preparing a MgO substrate is by in situ growth of a thin YBCO or YBCO analog film layer on the substrate. This same method could be used to prepare a different substrate buffered by YBCO or a YBCO analog film. A high vacuum system may be used for the in situ growth of YBCO (or YBCO analog) which may be deposited by laser ablation, sputtering, CVD (chemical vapor deposition), MBE (molecular beam epitaxy), or other deposition methods.

The preferred method of growing a TBCCO film on the thin YBCO (or YBCO analog) layer is to first deposit a precursor layer by laser ablation, sputtering, CVD, MBE or other deposition method. The precursor layer is then crystallized, preferably by annealing at high temperature in a reactor which controls the thallium loss during the post-deposition processing. This method is known as the Epitaxial Lowloss Film or ELF method and is described in detail in Olson et al., U.S. Pat. No. 5,071,830, and Eddy et al., U.S. Pat. No. 5,139,998, both of which are assigned to the applicants' assignee. As is mentioned above, thallium films are preferred because they achieve high $T_c$s.

Additional layers may be grown on the MgO or other substrate before deposition of the YBCO or YBCO analog layer. Having such additional layers allows progressive grading of any lattice mismatch between the substrate and the YBCO or YBCO analog (e.g. the lattice mismatch between YBCO and MgO is about 10%). By grading the lattice mismatch, there is a lesser likelihood of experiencing grain boundary rotations (i.e. lesser likelihood of seeing grains lying parallel to the growth surface but which are not aligned) and, therefore, a better nucleation layer is provided. Examples of acceptable grading layers include barium titanate ($BaTiO_3$), strontium titanate ($SrTiO_3$), barium zirconate ($BaZrO_3$), and calcium zirconate ($CaZrO_3$) among others. Such grading layers are well known by those skilled in the art.

In addition, it is well known by those skilled in the art that certain substrates require buffer layers to limit interdiffusion between the substrate and any overlying lying layer. Such buffer layers may be provided on substrates used in the present invention.

The growth of epitaxial HTS thin films which are thallium and copper oxide based, such as TBCCO, on large area substrates which have low dielectric constants enables the production of HTS devices which are useful for microwave and/or RF applications.

It is a principal object of the present invention to provide a thallium based HTS film which is suitable for microwave and/or RF applications.

It is also on object of the present invention to provide a thallium based HTS film on a substrate which is suitable for microwave and/or RF applications.

It is an additional object of the present invention to provide an epitaxial thallium based HTS film on a substrate which is suitable for microwave and/or RF applications.

It is a further object of the present invention to provide a thallium based HTS film on a magnesium oxide substrate.

It is another object of the present invention to provide a thallium based HTS film on a magnesium oxide substrate using as a nucleation layer a thin film which has growth characteristics and physical structures analogous to a yttrium based thin film.

It is yet another object of the present invention to provide a thallium based HTS film on a magnesium oxide substrate using as a nucleation layer a yttrium based or bismuth based thin film.

It is still another object of the present invention to determine and define growth conditions which are compatible for growth of the thallium based HTS films set forth above.

It is yet an additional object of the present invention to provide an HTS film which exhibits a linear response up to high RF current densities.

DETAILED DESCRIPTION OF THE PREFERRED EMBODIMENT

Figure 1A:
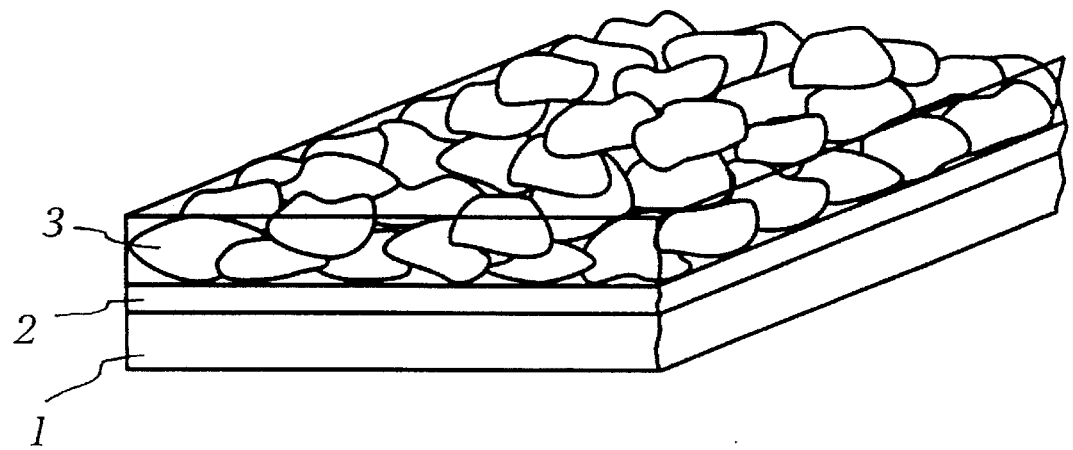
FIG. 1A is a cross sectional view of a substrate having a YBCO or YBCO analog thin film as a nucleation layer and a thallium based precursor layer.

A high quality, epitaxial high temperature superconducting (HTS) thin film containing thallium and copper oxide can be provided on MgO and other substrates. Such substrates preferably have characteristics favorable to microwave and/or RF applications. Using nucleation layers which provide a template for subsequent growth allows epitaxial growth of such thallium based HTS films on such substrates. Specifically, YBCO or a film having growth characteristics and physical structures analogous to YBCO (i.e. a YBCO analog) can be used as a nucleation layer on MgO to enable the growth of epitaxial TBCCO films suitable for microwave and/or RF applications.

For example, YBCO or a YBCO analog may be used as a nucleation layer between MgO and a thallium based HTS film. In situ growth of YBCO and YBCO analog films occurs in a single, epitaxial orientation on MgO (i.e. the films have analogous growth characteristics). Using a layer of such a YBCO or YBCO analog film as a nucleation layer for thallium based HTS films allows the orientation information to pass between the two superconducting layers.

However, when a YBCO film layer and a thallium based HTS layer are in contact yttrium will diffuse from the YBCO layer into the thallium based layer and thallium will diffuse from the thallium based layer into the YBCO layer. Where there is substantial interdiffusion between YBCO and thallium based layers a series of doped layers may result thereby degrading the superconducting properties of the thallium based HTS film relative to its pure phase.

To avoid such degradation due to interdiffusion, the present invention employs a relatively thin layer of YBCO or YBCO analog film which provides orientation information without poisoning the thallium based HTS layer to the point of degrading its superconducting properties. For example, four different thicknesses of YBCO film were deposited on MgO substrates. As is shown on Table 1, below, the YBCO film thicknesses ranged from 50 to 500 Å; the rocking curves of each were sharp (0.12° to 0.20°); one of the MgO substrates had no surface preparation and the other MgO substrates were polished with a Syton polish and annealed in air at 1100° C. for hours. High fields were used to test AC susceptibility to increase the sensitivity.

| YBCO Thickness | MgO Preparation | TBCCO Rocking Curve Width | $T_c$ (K) | High Field Delta $T_c$ |
|---|---|---|---|---|
| 50 Å | Syton 1100° C. | 0.54° | 103.9 (0.3) | 2.8 K |
| 100 Å | No Preparation | 0.48° | 100.6 (0.6) | 5.6 K |
| 200 Å | Syton 1100 ° C. | 0.48° | 102.8 (0.3) | 3.2 K |
| 500 Å | Syton 1100 ° C. | 0.48° | 103.7 (0.30) | 3 K |

There was an improvement in $T_c$ and $\Delta T_c$ for films grown on MgO substrate the surface of which was Syton polished and annealed in air at 1100° C. A typical TBCCO film on LaAlO$_3$ has a transition width at high field (4.2 gauss) of approximately 6 K. Therefore, sharper transition widths were obtained. An acceptable MgO substrate which exhibits results comparable to those of prepared MgO substrate yet which does not require surface preparation other than simple rinsing, is available from Akzo Corporation, Single Crystal Technology, B. V., Enschede, The Netherlands.

Figure 2:
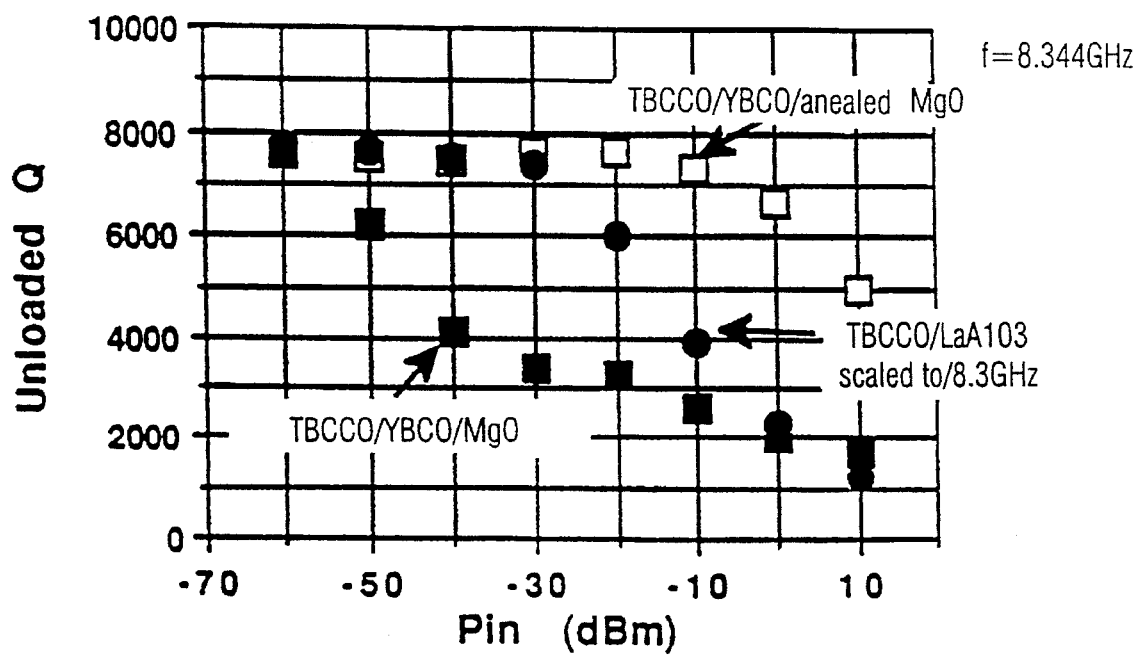
FIG. 2 shows the microwave performance of TBCCO films on MgO with a YBCO nucleation layer compared to the microwave performance of a TBCCO film on LaAlO$_3$.

FIG. 2 compares the microwave performance of three films: TBCCO on a YBCO buffered annealed MgO substrate; TBCCO on a YBCO buffered MgO substrate (no preparation); and TBCCO on LaAlO$_3$. A 7 mm long by 150 µm wide straight line resonator of each film was tested. The results shown in FIG. 2 plot Unloaded Q as a function of input power. As is shown in FIG. 2, all three of the tested films show comparable low power performance. The TBCCO on a YBCO buffered, Syton polished, and annealed MgO substrate, shown by the white squares on FIG. 2, exhibits one of the best power dependence observed for a TBCCO film measured at the applicants' assignee. This film also shows a substantially linear response at high RF power levels up to −20 dBm. The TBCCO on LaAlO$_3$ (black circles in FIG. 2) and the TBCCO on untreated MgO (black squares in FIG. 2) less acceptable power dependence. Indeed, the TBCCO on untreated MgO displayed degradation in Q as the power was increased, i.e. a non-linear response at high RF power levels. However, as is mentioned above, an acceptable MgO substrate which does not require surface preparation beyond that provided by the vendor is available from Akzo Corporation, The Netherlands, and does provide superior results.

In addition, the critical current density of the TBCCO film grown on Syton polished and annealed MgO which includes a nucleation layer of YBCO was measured. On a 200 µm×20 µm line, a $J_c$ of 1.5 ×106 A/cm$^2$ was measured at 77 K. This critical current density is higher than similar structures measured for TBCCO on LaAlO$_3$. Typical critical current densities of films grown on LaAlO$_3$ fall within a range of approximately 0.2–0.8 ×106 A/cm$^2$. The voltage criteria used for $J_c$ was 1 µV per 200 µm (i.e. one of the most sensitive measurements currently available).

It is clear that the microwave performance of the TBCCO film on a polished and annealed MgO substrate having a YBCO nucleation layer is better than that observed for TBCCO film on MgO or for TBCCO film on LaAlO$_3$. Therefore, such a TBCCO film may be fabricated as a microwave device which is capable of handling large powers at higher frequencies than are currently achieved in present HTS microwave devices. In addition, other thallium based HTS films may be similarly fabricated.

In preparing an epitaxial thallium based HTS film, such as TBCCO, on a substrate having a nucleation layer thereon, growing a YBCO or YBCO analog nucleation layer on the substrate is the starting point. However, preparation of the substrate should be considered. For example, there are two low energy, epitaxial orientations between YBCO and MgO. The grain boundary which is formed between the two orientations may be detrimental to the properties of the film. However, the growth surface of the MgO may be treated to promote single domain growth of the film. Such treatment may include polishing and annealing the MgO surface as is described above. In addition, such treatment may be provided by the vendor. As is mention above, an MgO substrate which requires no preparation (i.e. it has been sufficiently prepared by the vendor to obtain results comparable to those achieved with the polished and annealed MgO described above) is available directly from Akzo Corporation, The Netherlands.

The next step is growing the YBCO or YBCO analog film on the substrate. The preferred steps, which are consistent with current crystal growth technologies, are set out below. A high vacuum system is preferably used for the in situ growth of YBCO or other film by laser ablation, although other deposition processes (e.g. sputtering, CVD, MBE) would work. The system preferably allows precise control over all key deposition parameters including laser fluence, substrate temperature and gas pressure, which, in turn, makes the deposition process stable and reproducible. The laser energy density on the target is preferably varied from 2–5 Joules/cm$^2$ depending on the target stoichiometry and the oxygen pressure. Films are preferably deposited onto a substrate which has been sufficiently heated so an epitaxial film is formed without the necessity of post-deposition processing. Although this process may result in some laser ablation-induced particles on the surface of the film, these particles are at a reduced density.

Figure 1B:
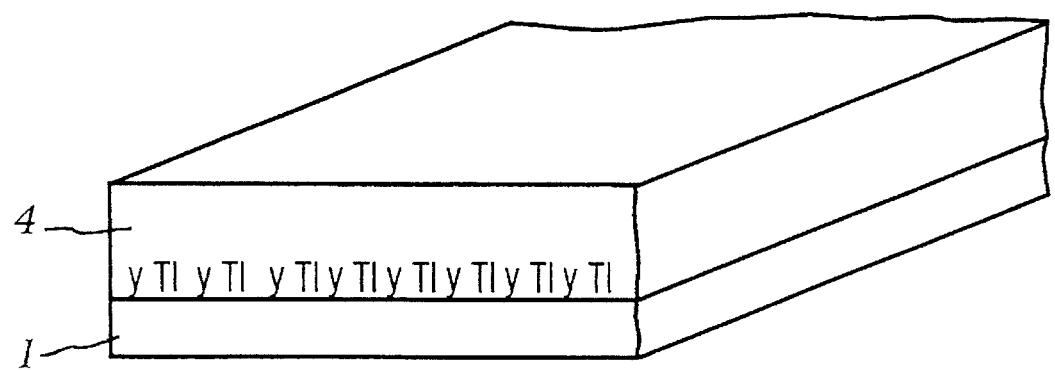
FIG. 1B shows a cross sectional view of the device of FIG. 1A after post-deposition thermal processing has crystallized the precursor layer.

Finally a thallium based HTS film is grown on the thin YBCO or YBCO analog nucleation layer. The preferred method of growing the thallium based film on the thin nucleation layer is to first form a precursor layer by laser ablation at room temperature, although other deposition processes (e.g. sputtering, CVD, MBE) would also work. FIG. 1A shows a substrate 1 with a thin YBCO analog nucleation layer 2 and a thallium based precursor layer 3. The targets for laser ablation are typically hot pressed from metal oxide powder mixtures. The precursor layer is then crystallized (i.e. converted to epitaxial superconducting film) by annealing at high temperature in a reactor which controls the thallium loss from the film during post-deposition processing. This method is known as the ELF (Epitaxial Lowloss Film) process and is described in detail in Olson et al., U.S. Pat. No. 5,071,830, and Eddy et al., U.S. Pat. No. 5,139,998, both of which are assigned to the applicants' assignee. FIG. 1B shows a substrate 1 with a crystallized YBCO analog / thallium based epitaxial superconducting layer 4. FIG. 1B also shows that there may be interdiffusion between the thallium based layer and, for example, the YBCO layer, but that the YBCO layer is sufficiently thin that the interdiffusion is not sufficient to affect the superconductivity of the thallium based layer.

The preferred process of the present invention, as is described above, has been successfully used to grow epitaxial thallium based HTS films on two inch MgO wafers which include a YBCO nucleation layer. Such films have been incorporated into high temperature superconductor devices.

Figure 3:
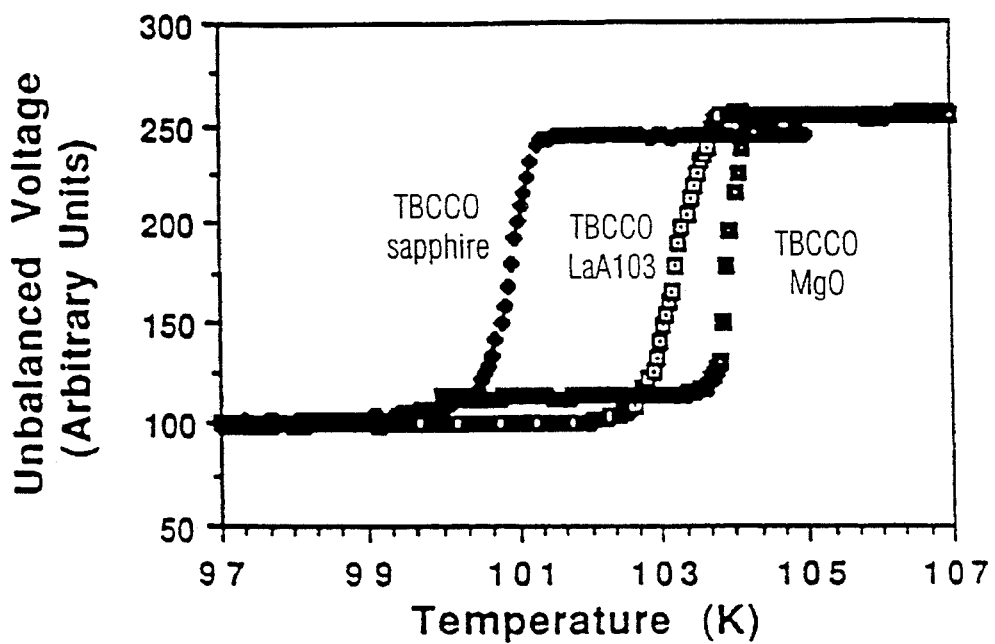
FIG. 3 shows the critical temperatures of TBCCO films on various substrates.

As is shown in FIG. 3, the critical temperatures achieved by thallium based HTS films on YBCO buffered MgO and other substrates are comparable to that achieved with a standard film on LaAlO$_3$. As is described above, the film on MgO exhibits some unexpected advantages (i.e. advantages in addition to being a substrate with a low dielectric constant). The sharpness of the susceptibility transition is a performance characteristic shown in all aspects of the performance of these films, such as good power dependence in a microwave circuit. In addition, the film exhibits linear response to high RF current densities, calculated to be up to 10$^6$ A/cm$^2$. Furthermore, as is mentioned above, FIG. 2 shows that the film has a substantially linear response up to $-20$ dBm input power.

The use of a YBCO or a YBCO analog film as a nucleation layer rather than as a superconducting film itself, removes some of the constraints on the growth parameters imposed by the necessity to produce high quality film if it were to be used as a superconductor. Consequently, the more forgiving growth parameters have greater reproducibility and enable the growth of double sided films. Previously, high quality, double sided films were difficult to prepare due to degradation in the superconducting properties of the first deposited side, presumably due to oxygen loss during deposition of the second side. Since only the orientation of the YBCO or YBCO analog layer is important to the present invention, double sided films are much less difficult to prepare.

Bismuth films could also be used as a nucleation layer in place of YBCO. Bismuth films have growth characteristics which are analogous to YBCO films. Particularly, bismuth films may be grown epitaxially by an in situ process. It is also known that bismuth films have physical structures similar to that of YBCO films in that the lattice structures in the a-b plane are similar. Therefore, bismuth films are suitable YBCO analogs and may be used in place of YBCO films described above. Other YBCO analogs could also be substituted for the YBCO nucleation layer described above, provided that they have similar crystal structures in the a-b plane and can be grown in situ.

Additional layers may be grown on the MgO or other substrate before deposition of the YBCO or YBCO analog layer. Having such additional layers allows progressive grading of any lattice mismatch between the substrate and the YBCO or YBCO analog (e.g. the lattice mismatch between YBCO and MgO is about 10%). By grading the lattice mismatch, there is a lesser likelihood of experiencing grain boundary rotations (i.e. lesser likelihood of seeing grains lying parallel to the growth surface but which are not aligned) and, therefore, a better nucleation layer is provided. Examples of acceptable grading layers include barium titanate (BaTiO$_3$), strontium titanate (SrTiO$_3$), barium zirconate (BaZrO$_3$), and calcium zirconate (CaZrO$_3$) among others. Such grading layers are well known by those skilled in the art.

In addition, it is well known by those skilled in the art that certain substrates require buffer layers to limit interdiffusion between the substrate and any overlying layer. Such buffer layers may be provided on substrates used in the present invention.

While embodiments of the present invention have been shown and described, various modifications may be made without departing from the scope of the present invention, and all such modifications and equivalents are intended to be covered.

What is claimed:

1. A method for forming an epitaxial thallium and copper oxide based superconducting film on a support comprising the steps of:

(1) forming an epitaxial layer of a YBCO analog about 10 Å to 600 Å thick on the support, (2) depositing a thallium and copper oxide based superconductor precursor layer on the YBCO analog layer, and (3) crystallizing the thallium and copper oxide based superconductor precursor layer to form the epitaxial thallium and copper oxide based superconducting film.

2. The method of claim 1 wherein the support is a substrate.

3. The method of claim 2 wherein the substrate is MgO.

4. The method of claim 1 wherein the support is a buffered substrate.

5. The method of claim 4 wherein the buffered substrate includes a layer of $BaTiO_3$, $SrTiO_3$, $BaZrO_3$, $CaZrO_3$, or a combination of at least two of $BaTiO_3$, $SrTiO_3$, $BaZrO_3$, or $CaZrO_3$.

6. The method of claim 1 wherein the epitaxial layer of a YBCO analog is between about 50 Å and 500 Å thick.

7. The method of claim 1 wherein the thallium and copper oxide based superconductor precursor layer is crystallized via a post-deposition thermal process.

8. The method of claim 1 wherein the YBCO analog is a YBCO, bismuth cuprate, neodymium cerium cuprate, lanthanum cuprate, or strontium cuprate film.

9. The method of claim 1 wherein the epitaxial layer of a YBCO analog is formed by an in situ process.

10. The method of claim 1 wherein the support is two sided, and the YBCO analog layer is formed on each side of the support, and the thallium and copper oxide based layer is formed on each YBCO analog layer on each side of the support.

11. A method for forming an epitaxial thallium based superconducting film on a substrate comprising the steps of:

(1) forming an epitaxial layer of a YBCO analog about 10 Å to 600 Å thick on the substrate by an in situ process, (2) depositing a thallium based superconductor precursor layer on the YBCO analog layer, and (3) crystallizing the thallium based superconductor precursor layer to form the epitaxial thallium based superconducting film by a post-deposition thermal process.

12. The method of claim 11 wherein the substrate is MgO.

13. The method of claim 12 wherein the MgO substrate is prepared by polishing.

14. The method of claim 13 wherein the polishing uses a Syton polish.

15. The method of claim 12 wherein the MgO substrate is prepared by polishing and annealing.

16. The method of claim 11 wherein the thallium based superconductor precursor layer is formed on the YBCO analog layer by laser ablation, sputtering, CVD, or MBE.

17. The method of claim 11 wherein the YBCO analog is a YBCO, bismuth cuprate, neodymium cerium cuprate, lanthanum cuprate, or strontium cuprate film.

18. The method of claim 11 wherein the substrate is two sided, and the YBCO analog layer is formed on each side of the substrate, and the thallium based layer is formed on each YBCO analog layer on each side of the substrate.

19. A method for forming an epitaxial thallium and copper oxide based superconducting film on a substrate comprising the steps of:

(1) forming an epitaxial layer of YBCO about 10 Å to 600 Å thick on a MgO substrate by an in situ process, (2) depositing a thallium and copper oxide based superconductor precursor layer on the YBCO layer, and (3) crystallizing the thallium and copper oxide based superconductor precursor layer to form the epitaxial thallium and copper oxide based superconducting film by a post-deposition thermal process.

20. A method for forming a superconducting article comprising an epitaxial thallium based superconducting film on a substrate comprising the steps of:

(1) forming a buffer layer of $BaTiO_3$, $SrTiO_3$, $BaZrO_3$, $CaZrO_3$, or a combination of at least two of $BaTiO_3$, $SrTiO_3$, $BaZrO_3$, or $CaZrO_3$ on the substrate, (2) forming an epitaxial layer of a YBCO analog about 10 Å to 600 Å thick on the buffer layer, (3) depositing a thallium based superconductor precursor layer on the YBCO analog layer, and (4) crystallizing the thallium based superconductor precursor layer to form the epitaxial thallium based superconducting film by a post-deposition thermal process.

21. The method of claim 20 wherein the substrate is a MgO substrate.

22. The method of claim 20 wherein the YBCO analog is a YBCO, bismuth cuprate, neodymium cerium cuprate, lanthanum cuprate, or strontium cuprate film.

23. The method of claim 20 wherein the YBCO analog layer is formed by an in situ process.

24. A method for forming a superconducting article comprising an epitaxial thallium based superconducting film on a substrate comprising the steps of:

(1) forming a thin epitaxial layer of a YBCO analog 10 Å to 600 Å thick on each side of a two sided substrate, (2) depositing a thallium based superconductor precursor layer on each YBCO analog layer on each side of the substrate, and (3) crystallizing the thallium based superconductor precursor layer to form the epitaxial thallium based superconducting film by a post-deposition thermal process.

25. The method of claim 24 wherein the YBCO analog is a YBCO, bismuth cuprate, neodymium cerium cuprate, lanthanum cuprate, or strontium cuprate film.

26. The method of claim 24 wherein the YBCO analog is formed by an in situ process.

27. A method for forming a thallium and copper oxide based superconducting film on a substrate comprising the steps of:

(1) forming an epitaxial YBCO analog nucleation layer 10 Å to 600 Å thick on the substrate, (2) forming the thallium and copper oxide based superconducting film on the nucleation layer.

28. The method of claim 27 wherein the substrate is MgO.

29. The method of claim 27 wherein the substrate is a buffered substrate.

30. The method of claim 27 wherein the epitaxial YBCO analog nucleation layer is between about 50 Å and 500 Å thick.

31. The method of claim 27 wherein the YBCO analog nucleation layer is a YBCO, bismuth cuprate, neodymium cerium cuprate, lanthanum cuprate, or strontium cuprate film.

32. The method of claim 27 wherein the substrate is two sided, and the YBCO analog nucleation layer is formed on each side of the substrate, and the thallium and copper oxide based layer is formed on each YBCO analog nucleation layer on each side of the substrate.

33. The method of claim 27 wherein the thallium and copper oxide based superconducting film is epitaxial to the substrate.

* * * * *

UNITED STATES PATENT AND TRADEMARK OFFICE
CERTIFICATE OF CORRECTION

PATENT NO. : 5,508,255
DATED : April 16, 1996
INVENTOR(S) : EDDY, Michael M.

It is certified that error appears in the above-indentified patent and that said Letters Patent is hereby corrected as shown below:

Column 6, line 58, "106" should be --$10^6$--.

Column 6, line 62, "106" should be --$10^6$--.

Signed and Sealed this

Third Day of September, 1996

Attest:

BRUCE LEHMAN

*Attesting Officer*     *Commissioner of Patents and Trademarks*